(12) United States Patent
Miyai et al.

(10) Patent No.: US 9,313,835 B2
(45) Date of Patent: Apr. 12, 2016

(54) PLANAR LIGHT EMITTING DEVICE

(71) Applicants: Panasonic Corporation, Kadoma (JP); Idemitsu Kosan Co., Ltd., Chiyoda-ku (JP)

(72) Inventors: Takao Miyai, Kadoma (JP); Hiroyuki Sasaki, Kadoma (JP)

(73) Assignees: Idemitsu Kosan Co., Ltd., Tokyo (JP); Panasonic Corporation, Kadoma-shi (JP)

( * ) Notice: Subject to any disclaimer, the term of this patent is extended or adjusted under 35 U.S.C. 154(b) by 0 days.

(21) Appl. No.: 14/348,477

(22) PCT Filed: Sep. 28, 2012

(86) PCT No.: PCT/JP2012/075069
§ 371 (c)(1),
(2) Date: Jun. 5, 2014

(87) PCT Pub. No.: WO2013/047742
PCT Pub. Date: Apr. 4, 2013

(65) Prior Publication Data
US 2014/0312764 A1  Oct. 23, 2014

(30) Foreign Application Priority Data

Sep. 30, 2011  (JP) ................................. 2011-218124

(51) Int. Cl.
*H05B 33/06* (2006.01)
*H01L 51/52* (2006.01)
*H05B 33/10* (2006.01)

(52) U.S. Cl.
CPC ............ *H05B 33/06* (2013.01); *H01L 51/5203* (2013.01); *H05B 33/10* (2013.01)

(58) Field of Classification Search
None
See application file for complete search history.

(56) References Cited

U.S. PATENT DOCUMENTS

2005/0218794 A1* 10/2005 Seo et al. ..................... 313/504
2005/0253507 A1* 11/2005 Fujimura et al. ............. 313/506
(Continued)

FOREIGN PATENT DOCUMENTS

EP  2 221 900 A2  8/2010
JP  2006 228455  8/2006
(Continued)

OTHER PUBLICATIONS

International Search Report Issued Nov. 13, 2012 in PCT/JP12/075069 Filed Sep. 28, 2012.
European Search Report mailed Nov. 7, 2015 in European Patent Application No. 12835986.6.

*Primary Examiner* — Ashok Patel
(74) *Attorney, Agent, or Firm* — Oblon, McClelland, Maier & Neustadt, L.L.P.

(57) ABSTRACT

A plurality of electric-power-supply units are formed along one side of a transparent substrate that describes a rectangular shape in planar view, and an electric-power-supply unit is formed along a side parallel to the one side. A connecting substrate is connected to the electric-power-supply unit by a connecting member. On the connecting substrate are formed five connecting electrodes on a main surface opposing the electric-power-supply units, and five connecting terminals on a main surface of the side opposite the main surface of the connecting substrate opposing the electric-power-supply units. The five connecting terminals and the five connecting electrodes are electrically connected by an anode bus line or a cathode bus line. The electric-power-supply units are electrically connected to each other via the anode bus line of the connecting substrate, and the electric-power-supply units are electrically connected to each other via the cathode bus line of the connecting substrate.

9 Claims, 9 Drawing Sheets

(56) References Cited

U.S. PATENT DOCUMENTS

| | | |
|---|---|---|
| 2011/0156084 A1 | 6/2011 | Choi et al. |
| 2011/0175523 A1* | 7/2011 | Kostka et al. ............ 313/512 |
| 2012/0007134 A1 | 1/2012 | Miyai et al. |
| 2013/0002126 A1 | 1/2013 | Sakaguchi |
| 2013/0093308 A1 | 4/2013 | Kagotani et al. |
| 2015/0357383 A1* | 12/2015 | Chung ............ H01L 27/3211 257/40 |

FOREIGN PATENT DOCUMENTS

| | | |
|---|---|---|
| JP | 2007 536708 | 12/2007 |
| JP | 2010-198980 | 9/2010 |
| JP | 2012 104316 | 5/2012 |
| WO | 2008 062645 | 5/2008 |
| WO | 2011 136205 | 11/2011 |
| WO | 2011 136262 | 11/2011 |
| WO | 2012 121251 | 9/2012 |

* cited by examiner

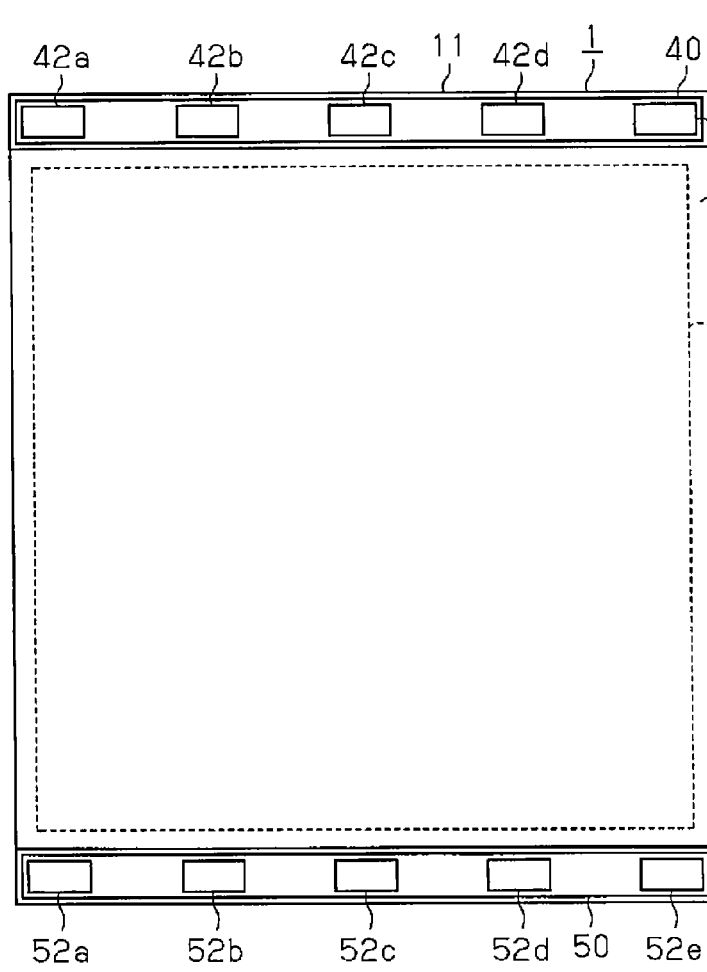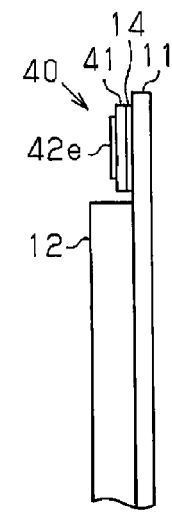

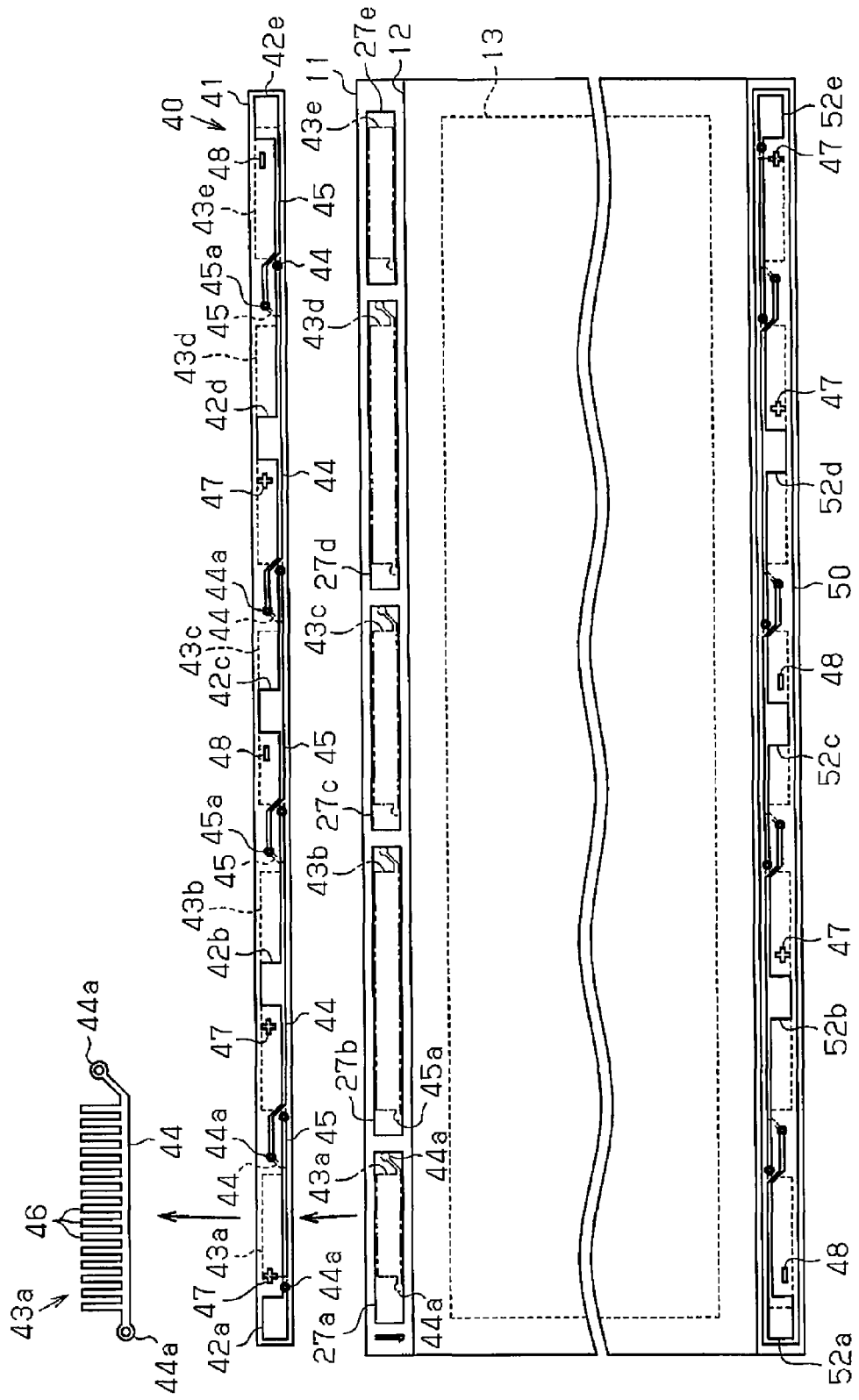

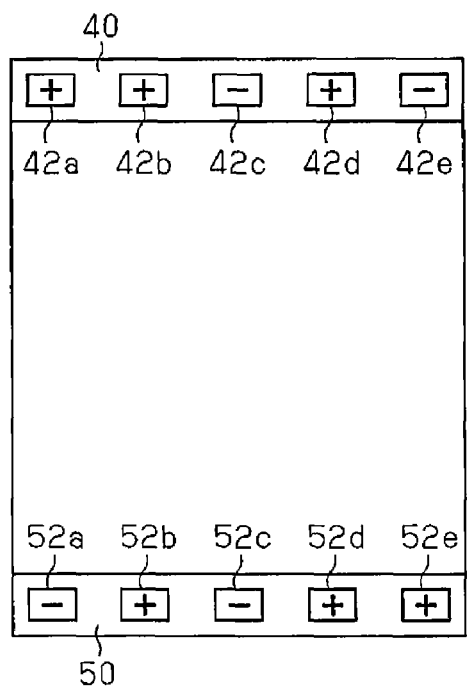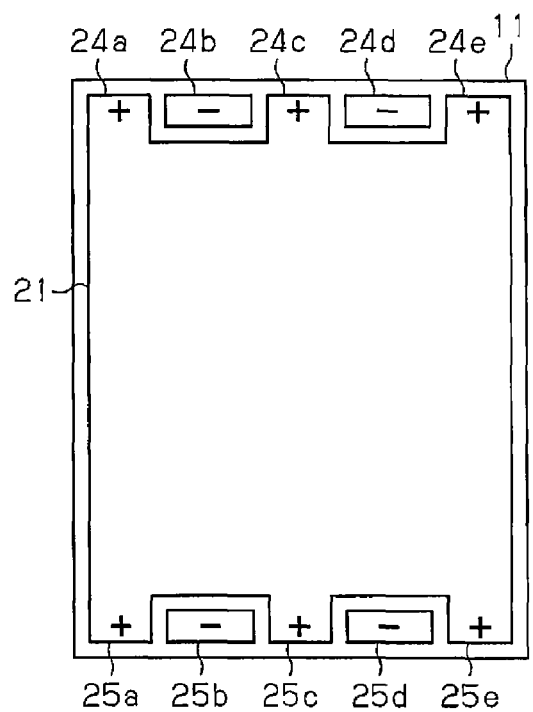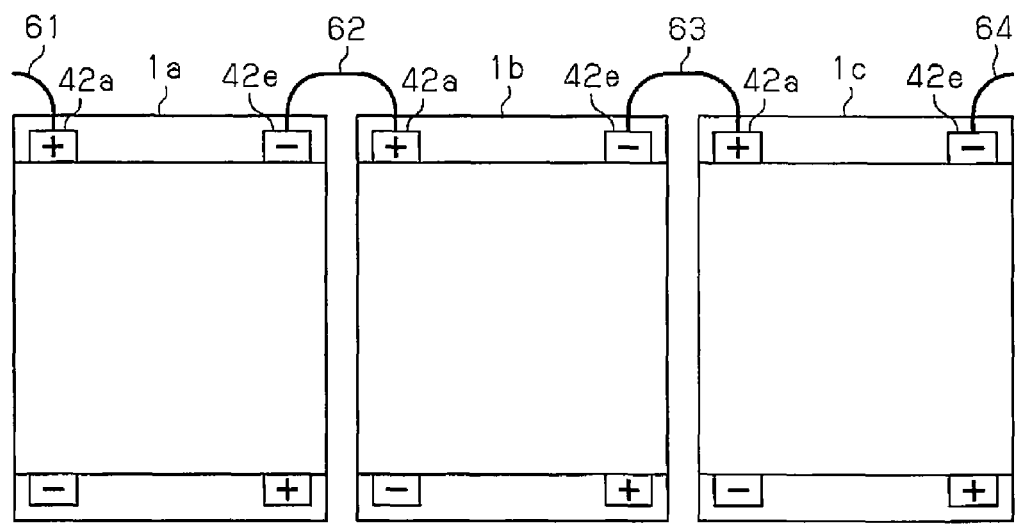

PLANAR LIGHT EMITTING DEVICE

TECHNICAL FIELD

The present invention relates to a planar light emitting device.

BACKGROUND ART

In the prior art, the application of a planar light emitting device using an organic electroluminescence element (organic EL element) has been proposed for lightings or the like. The light emitting device includes two electrodes and an organic EL layer including an organic light emitting layer arranged between two electrodes. The light emitting device emits light from the organic EL layer with current that flows through the organic EL layer in accordance with voltage applied between two electrodes. For example, at least two sets of terminals are formed on a substrate. The terminals of each set are each connected to a conductor and two electrodes. This supplies voltage to the organic EL layer (for example, refer to patent document 1).

PRIOR ART DOCUMENT

Patent Document

Patent Document 1: Japanese National Phase Laid-Open Patent Publication No. 2007-536708

SUMMARY OF THE INVENTION

Problems that are to be Solved by the Invention

In the above light emitting device, an increase in the number of terminals enlarges the area for formation of the conductor that is connected to the terminals and the electrodes. In other words, the substrate area used to supply power is increased. This enlarges the substrate with respect to the area of the organic EL layer that emits light.

It is an object of the present invention to provide a planar light emitting device that allows for a decrease in the area of the power supplying unit.

Means for Solving the Problems

To achieve the above object, a planar light emitting device according to the present invention includes a light emitting panel including a transparent substrate, which is tetragonal as viewed from above, an organic EL element, which is formed on one main surface of the transparent substrate and includes an anode and a cathode, and a plurality of power supplying units, which are formed along at least one side of the transparent substrate and are each connected to the anode and cathode of the organic EL element. A plurality of connection substrates include an insulation substrate arranged facing toward the power supplying units, a plurality of connection electrodes formed of a first main surface of the insulation substrate facing toward the power supplying units, a plurality of connection terminals formed on a second main surface of the insulation substrate on the opposite side of the first main surface, an anode bus line that electrically connects, among the connection terminals and the connection electrodes, a connection terminal and a connection electrode that correspond to the anode of the organic EL element to each other, and a cathode bus line that electrically connects, among the connection terminals and the connection electrodes, a connection terminal and a connection electrode that correspond to the cathode of the organic EL element to each other. A connection member electrically connects the power supplying units of the light emitting panel and the connection terminals of the connection substrates.

In the planar light emitting device, preferably, the anode bus line and the cathode bus line are formed facing toward the insulation substrate.

In the planar light emitting device, preferably, the anode bus line and the cathode bus line are arranged on the first main surface of the insulation substrate facing toward the power supplying units having the same polarity as the anode bus line and the cathode bus line. The anode bus line and the cathode bus line are arranged on the second main surface of the insulation substrate in correspondence with the power supplying units having a polarity that differs from the anode bus line and the cathode bus line. The insulation substrate includes a plurality of through holes electrically connecting the anode bus line and the cathode bus line respectively formed on the two surfaces of the insulation substrate so that same polarities are paired.

In the planar light emitting device, preferably, the power supplying units includes at least one anode power supplying unit connected to the anode of the organic EL element and at least one cathode power supplying unit connected to the cathode of the organic EL element. The anode bus line is arranged on the first main surface of the insulation substrate facing toward the at least one anode power supplying unit, and the cathode bus line is arranged on the first main surface of the insulation substrate facing toward the at least one cathode power supplying unit. The cathode bus line is arranged on the second main surface of the insulation substrate in correspondence with the at least one anode power supplying unit, and the anode bus line is arranged on the second main surface of the insulation substrate in correspondence with the at least one cathode power supplying unit. The insulation substrate includes at least one first through hole, which electrically connects the anode bus line formed on the two surfaces of the insulation substrate, and at least one second through hole, which electrically connects the cathode bus line formed on the two surfaces of the insulation substrate.

In the planar light emitting device, preferably, each of the power supplying unit includes a power supplying auxiliary electrode formed on a main surface facing toward the insulation substrate. Each of the through holes is arranged to be overlapped with the power supplying auxiliary electrode having the same polarity as the anode bus line or the cathode bus line connected to each of the through holes.

In the planar light emitting device, preferably, the power supplying units includes at least two power supplying units having the same polarity and arranged on each of two ends of two predetermined parallel sides of the insulation substrate. The connection terminals includes at least two connection terminals having different polarities arranged on each of two ends of two predetermined parallel sides of the insulation substrate.

In the planar light emitting device, preferably, the transparent substrate is tetragonal. The power supplying units are arranged along, among four sides of the transparent substrate, two predetermined parallel sides. The organic EL element includes one main surface of the anode. A plurality of auxiliary electrodes are formed on the one main surface of the anode of the organic EL element to extend along two sides that differ from the two predetermined parallel sides, and electrically connected to the anode.

In the planar light emitting device, preferably, the two connection terminals having different polarities are arranged on two ends of two predetermined parallel sides in the two connection substrates.

In the planar light emitting device, preferably, the connection electrodes are laid out spaced apart from each other along the anode bus line or the cathode bus line connected to the connection electrodes and include a plurality of sub-electrodes extending in a direction perpendicular to the anode bus line or the cathode bus line.

Effect of the Invention

The present invention provides a planar light emitting device that allows for a decrease in the area of the power supplying unit.

BRIEF DESCRIPTION OF THE DRAWINGS

FIG. 1A is a rear view of one embodiment of a planar light emitting device, and FIG. 1B is a cross-sectional view of the planar light emitting device;

FIG. 3 is a schematic view showing the end of the light emitting panel and a connection substrate;

FIGS. 4A and 4B are schematic diagrams showing electrode layouts;

FIG. 5 is a schematic diagram illustrating the connection of the planar light emitting device;

EMBODIMENTS OF THE INVENTION

Figure 2:
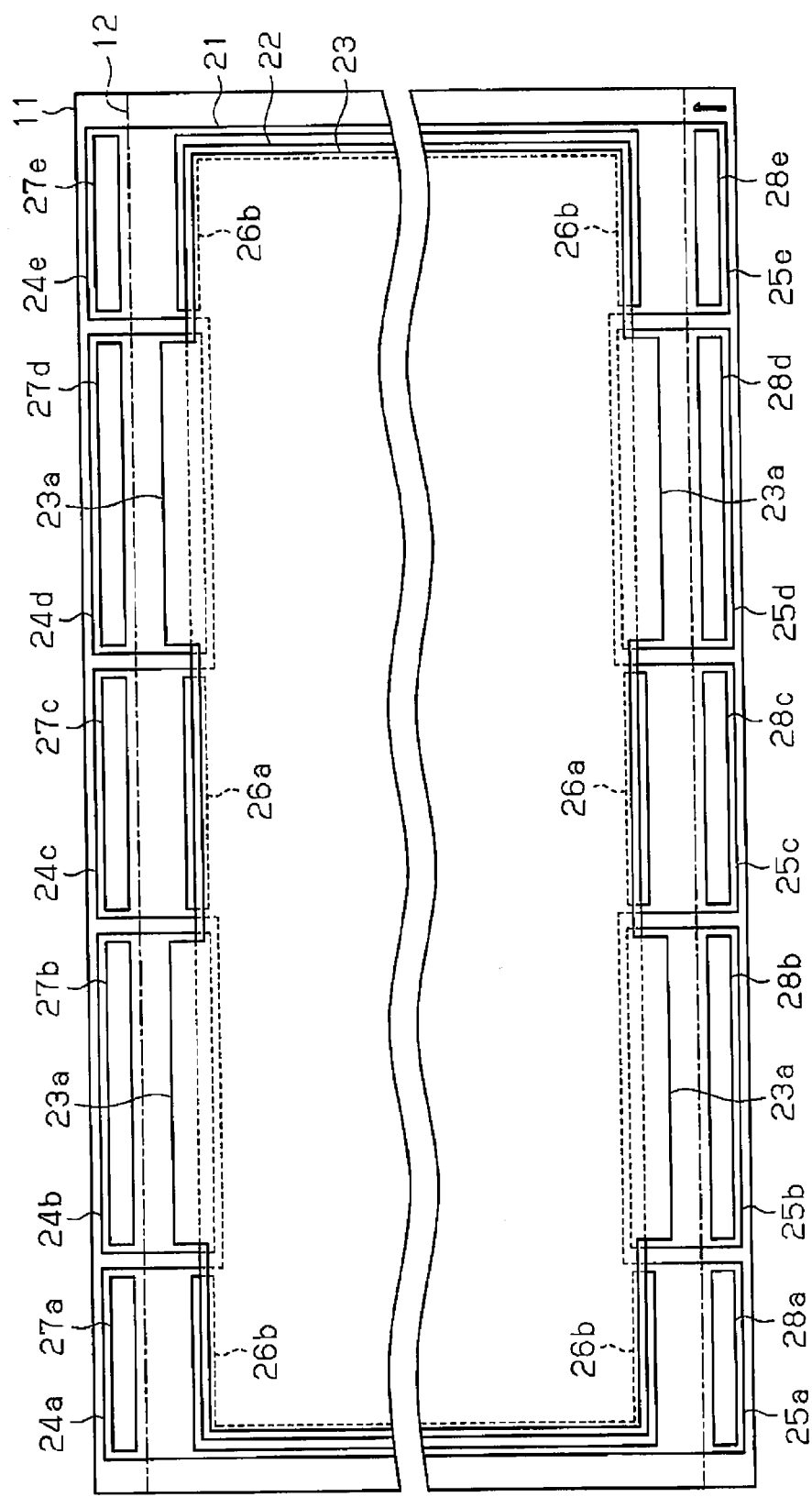
FIG. 2 is an enlarged view showing an end of a light emitting panel.

One embodiment of a planar light emitting device will now be described with reference to FIGS. 1 to 9.

As shown in FIG. 1A, a light emitting panel of a planar light emitting device 1 includes a transparent substrate 11, which is tetragonal as viewed from above (rectangular as viewed from above in the illustrate example). A cover glass 12, which is tetragonal as viewed from above (square as viewed from above in the illustrated example), is fixed, for example, by a non-conductive adhesive to one main surface of the transparent substrate 11. The cover glass 12 is a sealing member that seals an organic EL element 13 formed on the main surface of the transparent substrate 11.

Among the main surfaces of the transparent substrate 11, the planar light emitting device 1 uses the surface to which the cover glass 12 is not fixed (non-fixed surface) as a light emission surface (light emitting surface). The transparent substrate 11 is, for example, a glass substrate. In addition to a glass substrate, for example, a transparent resin film substrate may be used as the transparent substrate 11.

Two connection substrates 40 and 50 that supply power to the organic EL element 13 are arranged on the main surface of the transparent substrate 11. In this embodiment, one side of the square cover glass is set to be equal to the length of the short side of the rectangular transparent substrate 11. The cover glass 12 is fixed to the middle of the transparent substrate in the longitudinal direction. Accordingly, the two longitudinal ends of the transparent substrate 11 are exposed from the cover glass 12. The two connection substrates 40 and 50 are located on the main surface of the transparent substrate 11 at portions exposed from the cover glass 12. The two connection substrates 40 and 50 extend along the sides (short sides) of the transparent substrate 11.

As shown in FIG. 1B, the connection substrate 40 is press-fitted to the transparent substrate 11 by a conductive connection member 14 (e.g., anisotropic conductive (ACP) film). Although not shown in the drawings, in the same manner, the connection substrate 50 is compression-bonded to the main surface of the transparent substrate 11 by a conductive adhesive.

As shown in FIG. 1A, a plurality of (five in the drawing) connection terminals 42a to 42e are formed on one main surface (non-adhered surface) of the connection substrate 40. Each of the connection terminals 42a to 42e are tetragonal as viewed from above (in the illustrated example, rectangular as viewed from above). Each of the connection terminals 42a to 42e is connected to either one of the anode and cathode of the organic EL element 13.

In the present embodiment, the three connection terminals 42a, 42b, and 42d are connected to the anode of the organic EL element, and the two connection terminals 42c and 42e are connected to the cathode of the organic EL element 13. Accordingly, the connection terminals 42a, which is connected to the anode, and the connection terminal 42e, which is connected to the cathode, are located at the two ends of the connection substrate 40. Further, the connection terminal 42c, which is connected to the cathode, is located at the generally middle section of the connection substrate. The two connection terminals 42b and 42d, which are connected to the anode, are located at the two opposite sides of the connection terminal 42c.

In the same manner, a plurality of (five in the drawing) connection terminals 52a to 52e are formed on one main surface (non-adhered surface) of the connection substrate 50. Each of the connection terminals 52a to 52e is connected to either one of the anode and cathode of the organic EL element 13.

The structure of the light emitting panel will now be described.

As shown in FIG. 2, the organic EL element 13 includes a planar anode 21 that is formed on the main surface of the transparent substrate 11 and tetragonal as viewed from above (e.g., square as viewed from above). The planar anode 21 is formed by, for example, a transparent conductive film such as an ITO film or an IZO film. An organic layer 22 is formed on a main surface of the planar anode 21 opposite to the main surface facing toward the transparent substrate 11. The organic layer 22 includes at least a light emitting layer and is tetragonal as viewed from above (e.g., square as viewed from above). A planar cathode 23 is formed on a main surface of the organic layer 22 opposite to the main surface facing toward the planar anode 21. The planar cathode 23 faces toward the planar anode 21 and is tetragonal as viewed from above (e.g., square as viewed from above). The planar cathode 23 is a metal film having a smaller resistance and a smaller work function than a transparent conductive film. For example, the metal film is a laminated film including an aluminum (Al) film, a magnesium (Mg) film, and a silver (Ag) film.

A plurality of (five in the drawing) power supplying units 24a to 24e and 25a to 25e, which are spaced apart from one another, are arranged on the main surface of the transparent substrate 11 at the two longitudinal ends of the transparent substrate 11 along the short sides of the transparent substrate 11 (sides extending in the lateral direction in the drawing). Each of the power supplying units 24a to 24e and 25a to 25e are formed from the same material as the planar anode 21 and tetragonal as viewed from above.

The six power supplying units 24a, 24c, 24e, 25a, 25c, and 25e are arranged at the two ends and middle of the short sides of the transparent substrate 11 and electrically connected to the planar anode 21. In the description hereafter, the power supplying units 24a, 24c, 24e, 25a, 25c, and 25e may be referred to as the anode power supplying units.

The four power supplying units 24b, 24d, 25b, and 25d are located between the six anode power supplying units 24a, 24c, 24e, 25a, 25c, and 25e. Each of the power supplying units 24b, 24d, 25b, and 25d is electrically connected to a wire 23a, which extends from the planar cathode 23 in the longitudinal direction of the transparent substrate 11 (vertical direction as viewed in the drawing). In the description hereafter, the power supplying units 24b, 24d, 25b, and 25d may be referred to as the cathode power supplying units.

The organic EL element 13 is formed so that the light emitting layer in the organic layer 22 emits light when DC voltage is supplied between the planar anode 21 and the planar cathode 23. The organic layer 22 includes a light emitting layer, which is formed from an organic molecular material that obtains light having the desired color, a hole transport layer, which is located between the light emitting layer and the planar anode 21, and an electron transport layer, which is located between the light emitting layer and the planar cathode 23. The structure of the organic layer 22 is not particularly limited. For example, when the desired color of the organic layer 22 is white, the structure of the organic layer 22 may employ a laminated structure including a hole transport layer, a light emitting layer, and an electron transport layer that dopes the light emitting layer with dopant dyes for the three colors of red, green, and blue. Further, the organic layer 22 may employ a laminated structure of a blue hole transport light emitting layer, a green electron transport light emitting layer, and a red electron transport light emitting layer. The organic layer 22 may also employ a laminated structure of a hole transport layer, a blue electron transport light emitting layer, a green electron transport light emitting layer, and a red electron transport light emitting layer. Further, the transparent substrate 11 may contain one or more fluorescent bodies. The one or more fluorescent bodies are excited by the light from the light emitting layer of the organic layer 22 and emit light having a longer wavelength than then the light from the light emitting layer. In this case, white light may be obtained when the light emitting layer emits blue light, and the fluorescent body emits yellow light. Further, the organic layer 22 may be formed by only light emitting layer and without the hole transport layer and the electron transport layer.

A generally tetragonal frame shaped auxiliary electrode extends along the periphery of the organic layer 22 on the main surface of the planar anode 21 opposite to the main surface facing toward the transparent substrate 11, that is, between the planar anode 21 and the organic layer 22. The auxiliary electrode is electrically connected to the planar anode 21. At the basal ends of the anode electrode power supplying units 24a, 24c, 24e, 25a, 25d, and 25e, the auxiliary electrode includes a plurality of auxiliary electrodes 26a, which extend along the periphery of the organic layer 22 and are tetragonal as viewed from above, and a plurality of auxiliary electrodes 26b, which extend along the long sides of the transparent substrate 11. The auxiliary electrodes 26a and 26b are formed from a material having a smaller resistance than the planar anode 21, for example, a laminated film including a chromium (Cr) film and a gold (Au) film. The auxiliary electrodes 26a and 26b may each be formed by a laminated film of a molybdenum (Mo) film, an Al film, and an Mo film.

The auxiliary electrodes 26a and 26b substantially equalize the potential around the planar anode 21. More specifically, the auxiliary electrodes 26a and 26b improve voltage uniformity of the planar anode 21 in the longitudinal direction of the transparent substrate 11. The planar anode 21, which is formed from a transparent conductive film, is supplied with drive current via the three anode power supplying units 24a, 24c, and 24e formed on the longitudinal ends of the transparent substrate 11. Thus, the planar anode 21 forms a potential gradient with the resistance value in the longitudinal direction of the transparent substrate. The auxiliary electrodes 26a and 26b extend along the sides of the transparent substrate 11 in the longitudinal direction and are electrically connected to the planar anode 21. Accordingly, drive current flows from the frame-shaped auxiliary electrodes 26a and 26b toward the planar anode 21 and improves the potential gradient. This reduces uneven brightness in the light emitting surface of the organic EL element 13 caused by the potential gradient.

Power supplying auxiliary electrodes 27a to 27e and 28a to 28e are formed on the main surfaces of the power supplying units 24a to 24e and 25a to 25e facing toward the connection substrate 40. The power supplying auxiliary electrodes 27a to 27e and 28a to 28e are each tetragonal as viewed from above and extend along the sides of the transparent substrate 11 (short sides, in the drawing, the upper and lower sides extending in the lateral direction). The power supplying auxiliary electrodes 27a to 27e and 28a to 28e are electrically connected to the corresponding power supplying units 24a to 24e and 25a to 25e. The power supplying auxiliary electrodes 27a to 27e and 28a to 28e may each be formed by a laminated film of a molybdenum (Mo) film, an Al film, and an Mo film.

The power supplying auxiliary electrodes 27a to 27e and 28a to 28e have the corresponding power supplying units 24a to 24e and 25a to 25e contact external conductors (electrodes formed on the connection substrates 40 and 50) and reduce contact resistance with the external conductors and variations in the contact resistance as compared with an electrical connection. This improves the light emitting efficiency of the planar light emitting device 1.

The structures of the two connection substrates 40 and 50 will now be described.

The two connection substrates 40 and 50 have identical structures. Thus, the structure of the connection substrate 40 will be described but not the connection substrate 50.

Referring to FIG. 3, the connection substrate 40 includes an insulation substrate 41, which is tetragonal as viewed from above (e.g., rectangular as viewed from above). The insulation substrate 41 is, for example, a flexible substrate such as a polyimide resin film.

The connection terminals 42a to 42e are formed on one main surface of the insulation substrate 41. The connection electrodes 43a to 43e are formed on the main surface of the insulation substrate 41 opposite to the main surface facing toward the connection terminals 42a to 42e. The connection electrodes 43a to 43e are connected to the power supplying units 24a to 24e via the connection member 14 shown in FIG. 1B and the power supplying auxiliary electrodes 27a to 27e.

Among the connection terminals 42a to 42e and the connection electrodes 43a to 43e, terminals and electrodes of the same polarity are electrically connected to one another by a bus line. In detail, the insulation substrate 41 includes anode bus lines 44 and cathode bus lines 45, which extend in the laid out direction of the connection terminals 42a to 42e and the connection electrodes 43a to 43e, that is, the longitudinal direction of the insulation substrate 41 (direction perpendicular to longitudinal direction of the transparent substrate 11). The anode bus lines 44 and the cathode bus lines 45 are formed on the insulation substrate 41 along substantially the same straight line as viewed from above. That is, the anode bus lines 44 and the cathode bus lines 45 are formed on the two main surfaces of the insulation substrate 41 facing toward each other. Bus lines having the same polarity as the power supplying units 24a to 24e are formed on the surface of the insulation substrate 41 facing toward the power supplying units 24a to 24e and bus line having a different polarity are formed on the surface opposite to the surface facing toward the power supplying units 24a to 24e.

For example, an anode bus line 44 is formed on the surface of the insulation substrate 41 facing toward the power supplying unit 24a connected to the planar anode 21. The cathode bus line 45 is formed facing toward the anode bus line 44 through the insulation substrate 41. A cathode bus line 45 is formed on the main surface of the insulation substrate 41 facing toward the power supplying unit 24b, which is adjacent to the power supplying unit 24a and connected to the planar cathode 23. An anode bus line 44 is formed facing toward that cathode bus line 45 through the insulation substrate 41.

The anode bus lines 44 formed on each of the two main surfaces of the insulation substrate 41 are electrically connected to each other by through holes 44a, and the cathode bus lines 45 are electrically connected to each other by through holes 45a. The through holes 44a connecting the anode bus lines 44 are formed to be overlapped with the power supplying units 24a, 24c, and 24e that have the same polarity. In the same manner, the through holes 45a connecting the cathode bus lines 45 are formed to be overlapped with the corresponding power supplying units 24b and 24d. The anode bus lines 44 and the cathode bus lines 45 are formed to detour bus lines and through holes having the opposite polarity on the same surface.

The five connection electrodes 43a to 43e formed on the main surface of the insulation substrate 41 facing toward the transparent substrate 11 are each electrically connected to a bus line having the corresponding polarity. The connection electrode 43a includes a plurality of sub-electrodes 46 extending in a direction perpendicular to the anode bus lines 44. Although not shown in the drawings, each of the connection electrodes 43b to 43e includes a plurality of the sub-electrodes 46 like the connection electrode 43a. The connection electrodes 43a and 43e formed in this manner improves the compression-bonding with the connection member 14. In this manner, each of the connection electrodes 43a to 43e includes a plurality of sub-electrodes and limits defoliation of the connection substrate 40 from the transparent substrate 11.

Each of the connection terminals 42a to 42e, the connection electrodes 43a to 43e, the bus lines 44 and 45, and the through holes 44a and 4a are formed by, for example, an alloy of copper (Cu), silver (Ag), copper, and the like and a plurality of metal foil layers. Plating of metal or the like may also be applied.

A plurality of polarity marks 47 and 48 indicating the polarities of the connection terminals 42a to 42e are formed on the main surface of the connection substrate 40 on which the connection terminals 42a to 42e are formed. For example a "+" polarity mark 47 indicating connection to the planar anode 21 is formed proximal to each of the connection terminals 42a, 42b, and 42d. Further, a "−" polarity mark 48 indicating connection to the planar cathode 23 is formed proximal to each of the connection terminals 42c and 42e.

The operation of the planar light emitting device 1 will now be described.

As shown in FIG. 4A, in the planar light emitting device 1, the two connection substrates 40 and 50 are each compression-bonded to the two parallel sides of the tetragonal transparent substrate 11. The connection substrate 40 includes the five connection terminals 42a to 42e. The connection substrate 50 includes the five connection terminals 52a to 52e. In the tetragonal planar light emitting device 1, at one of the two parallel sides (upper side in the drawing), the connection terminal 42a, which is located on the first end (left end), is connected to the planar anode 21 of the organic EL element 13, and the connection terminal 42e, which is located on the second end (right end), is connected to the planar cathode 23 of the organic EL element 13. At the other one of the two parallel sides (lower side in the drawing) of the planar light emitting device 1, the connection terminal 52a, which is located on the first end (left end), is connected to the planar cathode 23 of the organic EL element 13, and the connection terminal 52e, which is located on the second end (right end), is connected to the planar anode 21 of the organic EL element 13. In the description hereafter, a connection terminal connected to the planar anode 21 will be referred to as an anode terminal, and a connection terminal connected to the planar cathode 23 is referred to as a cathode terminal.

As shown in FIG. 4B, the three power supplying units 24a, 24c, and 24e, which are connected to the planar anode 21, and the two power supplying units 24b and 24d, which are connected to the planar cathode 23 (refer to FIG. 2), are alternately arranged on one of the two opposing sides (upper side in the drawing) of the transparent substrate 11 in the planar light emitting device 1. In the same manner, the three power supplying units 25a, 25c, and 25e, which are connected to the planar anode 21, and the two power supplying units 25b and 25d, which are connected to the planar cathode 23 (refer to FIG. 2), are alternately arranged on the other one of the two opposing sides (lower side in the drawing) of the transparent substrate 11 in the planar light emitting device 1. Accordingly, the four power supplying units 24a, 24e, 25a, and 25e, which are connected to the planar anode 21, are arranged at the two ends of the two opposing sides.

Among the connection terminals 42a to 42e shown in FIG. 4A, the three connection terminals 42a, 42b, and 42d having the same polarity, are electrically connected to one another through the bus lines 44 (refer to FIG. 3) formed on the connection substrate 40. In the same manner, the two connection terminals 42c and 42e having the same polarity are electrically connected to each other through the bus lines 45 (refer to FIG. 3) formed on the connection substrate 40.

Two of the connection terminals 42a to 42e (e.g., the two connection terminals 42b and 42c), which are formed on the connection substrate 40, are connected to the ends of two external wires. This supplies the two connection terminals with drive power through the two external wires. The drive voltage supplied to the connection terminal 42b is supplied substantially equally to the three power supplying units 24a, 24c, and 24e shown in FIG. 4B by the bus lines 44 or the like formed on the connection substrate 40. In the same manner, the drive voltage supplied to the connection terminal 42c is supplied substantially equally to the two power supplying units 24b and 24d shown in FIG. 4B by the bus lines 45 or the like formed on the connection substrate 40. Further, the drive voltage supplied to the three power supplying units 24a, 24c, and 24e is transmitted by the three supplying units 25a, 25c, and 25e to the two auxiliary electrodes 26a and 26b (refer to FIG. 2). Each of the power supplying units 25a, 25c, and 25e is electrically connected to a bus line formed on the connection substrate 50. In this manner, by supplying drive voltage to one of the two connection substrates 40 and 50, drive voltage may be supplied to the six power supplying units 24a, 24c, 24e, 25a, 25c, and 25e formed on the transparent substrate 11.

When connecting the connection terminal 42a, which is formed on the connection substrate 40, to each of the external wires of the connection terminal 52a, which is formed on the connection substrate 50, drive voltage is supplied in the same manner as described above.

In this manner, the planar light emitting device 1 may be supplied with drive power through the connected external wires from any direction by using the connection substrate 40, which includes the connection terminals 42a to 42e that are connected to one another by the bus lines 44 and 45, and the connection substrate 50, which is formed in the same manner. This increases the degree of freedom in the direction for supplying drive power to the planar light emitting device 1.

The use of the two connection substrates 40 and 50 on which the connection terminals 42a to 42e and 52a to 52e are arranged as described above allows for each connection of a plurality of planar light emitting devices 1.

For example, as shown in FIG. 5, three planar light emitting devices 1a, 1b, and 1c, which are formed in the same manner, are arranged next to one another in the layout direction of the connection terminals (direction perpendicular to the longitudinal direction of the transparent substrate 11). As a result, the cathode terminal 42e of the planar light emitting device 1a is adjacent to the anode terminal 42a of the planar light emitting device 1b. In the same manner, the cathode terminal 42e of the planar light emitting device 1b is adjacent to the anode terminal 42a of the planar light emitting device 1c. The three adjacent planar light emitting devices 1a to 1c may be easily connected in series by connecting the anode terminal 42a and the cathode terminal 42e with external wires 62 and 63. Further, in the three adjacent planar light emitting devices 1a to 1c, the cathode terminal 42e and the anode terminal 42a are adjacent to each other and may be connected by short external wires 62 and 63.

DC voltage serving as drive power is supplied by an external wire 61, which is connected to the anode terminal 42a of the planar light emitting device 1a, and an external wire 64, which is connected to the anode terminal 42e of the planar light emitting device 1c. In this case, the three planar light emitting devices 1a to 1c are connected in series with respect to the DC voltage, and equal current flows through each of the planar light emitting devices 1a to 1c. Accordingly, the planar light emitting devices 1a to 1c emit light with the same brightness.

Figure 6:
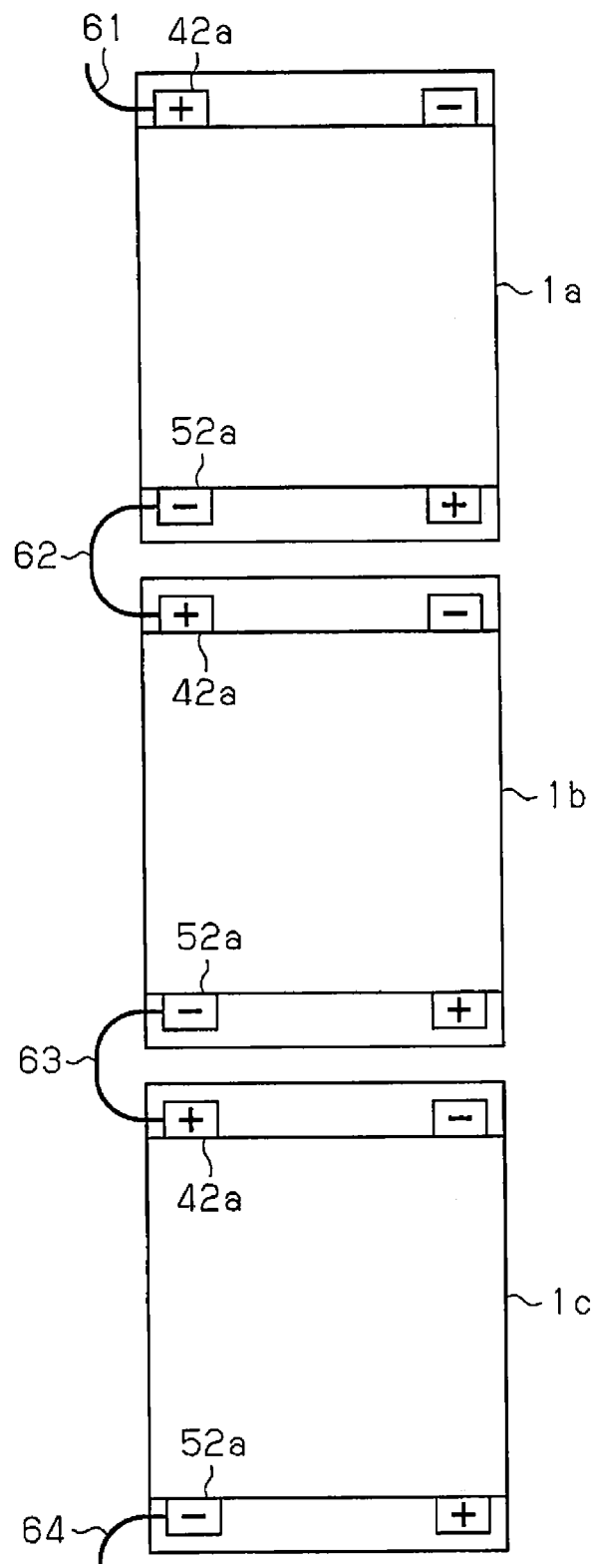
FIG. 6 is a schematic diagram illustrating the connection of the planar light emitting device.

As shown in FIG. 6, the three planar light emitting devices 1a to 1c formed in the same manner are arranged adjacent to one another along a direction (longitudinal direction of the transparent substrate 11) that is perpendicular to the connection terminal layout direction. Thus, the cathode terminal 52a of the planar light emitting device 1a is adjacent to the anode terminal 42a of the planar light emitting device 1b. In the same manner, the cathode terminal 52a of the planar light emitting device 1b is adjacent to the anode terminal 42a of the planar light emitting device 1c. By connecting the anode terminal 42a and the cathode terminal 52a with the external wires 62 and 63, the three planar light emitting devices 1a to c may easily be connected in series.

Figure 10:
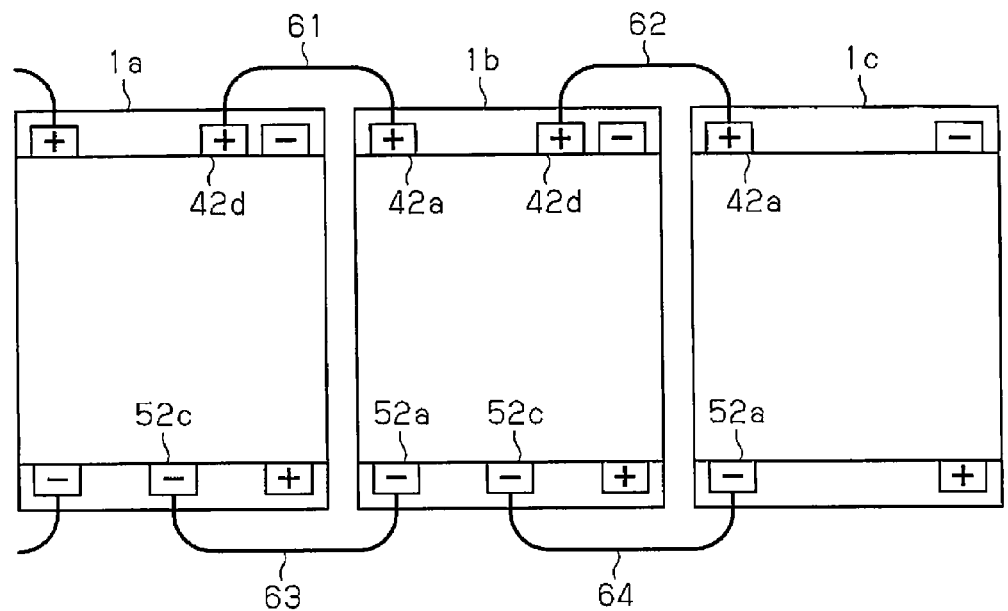
FIG. 10 is a schematic diagram illustrating the connection of the planar light emitting device.

As shown in FIG. 10, the four external wires 61 to 64 connect the three planar light emitting devices 1a to 1c, which are formed in the same manner. As shown in FIG. 4A, each of the planar light emitting devices 1a to 1c includes the six anode terminals 42a, 42b, 42d, 52a, 52b, and 52d and the four cathode terminals 42c, 42e, 52c, and 52e. The external wire 61 connects the anode terminal 42d of the planar light emitting device 1a with the anode terminal 42a of the planar light emitting device 1b. In the same manner, the external wire 62 connects the anode terminal 42d of the planar light emitting device 1b with the anode terminal 42a of the planar light emitting device 1c. Further, the external wire 63 connects the cathode terminal 52c of the planar light emitting device 1a with the cathode terminal 52a of the planar light emitting device 1b. The external wire 64 connects the cathode terminal 52c of the planar light emitting device 1b with the cathode terminal 52a of the planar light emitting device 1c. In this manner, the three planar light emitting devices 1a to 1c may easily be connected in parallel.

Figure 7:
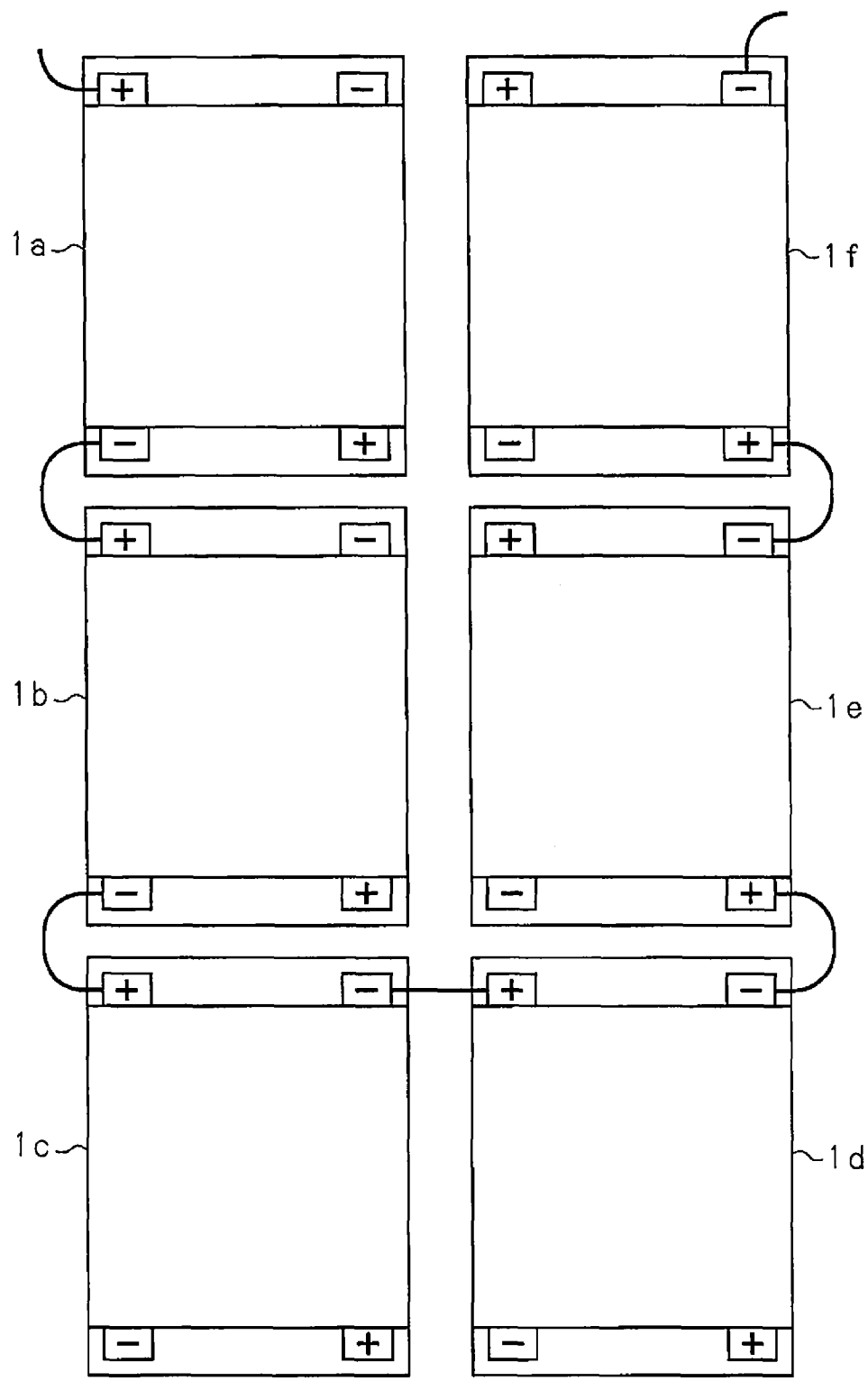
FIG. 7 is a schematic diagram illustrating the connection of the planar light emitting device.

As shown in FIG. 7, six planar light emitting devices 1a to 1f, which are laid out in a matrix, may easily be connected in series.

Figure 8:
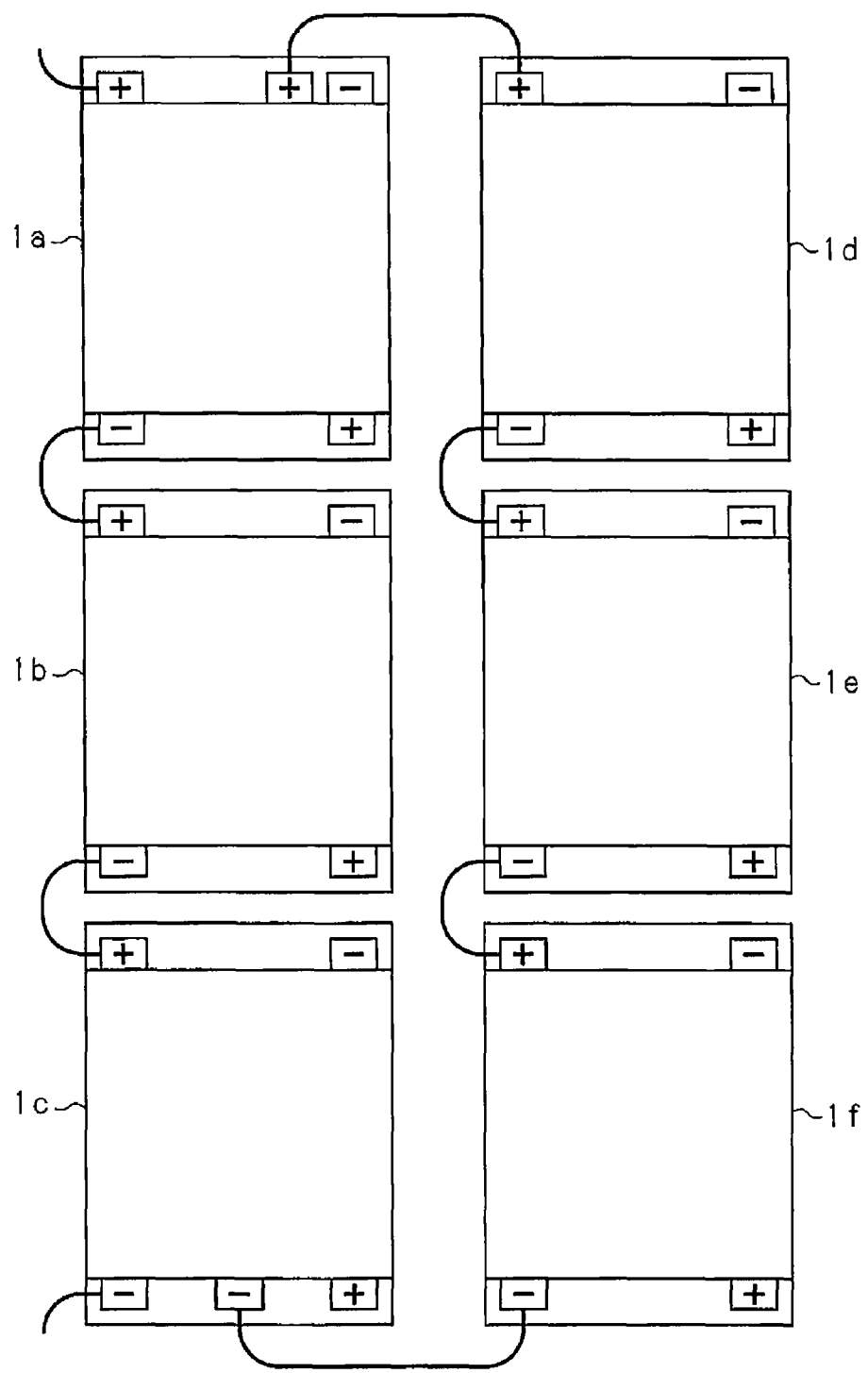
FIG. 8 is a schematic diagram illustrating the connection of the planar light emitting device.

As shown in FIG. 8, in six planar light emitting devices 1a to 1f, which are laid out in a matrix, the three planar light emitting devices 1a to 1c are connected in series, the three planar light emitting devices 1d to 1f are connected in series, and the three series-connected planar light emitting devices 1a to 1c are connected in parallel to the three planar light emitting devices 1d to 1f.

Figure 9A:
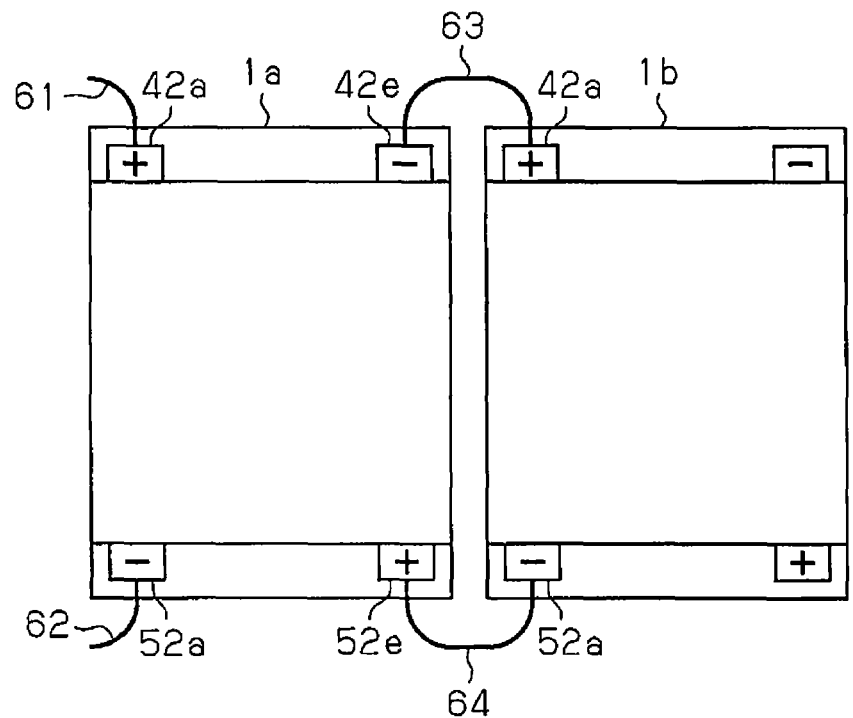
FIG. 9A is a schematic diagram illustrating the connection of the planar light emitting device.
Figure 9B:
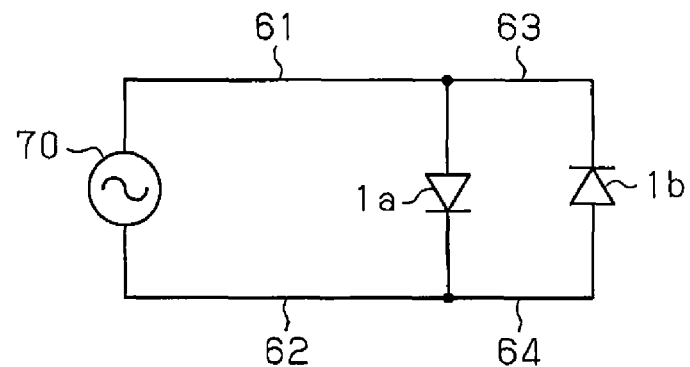
FIG. 9B is an equivalent circuit diagram.

As shown in FIG. 9A, the two planar light emitting devices 1a and 1b are arranged adjacent to each other. The external wire 63 connects the cathode terminal 42e of the planar light emitting device 1a and the anode terminal 42a of the planar light emitting device 1b. Further, the external wire 64 connects the anode terminal 52e of the planar light emitting device 1a and the cathode terminal 52a of the planar light emitting device 1b. In this case, the planar light emitting devices 1a and 1b are connected as shown in FIG. 9B. Accordingly, as shown in FIG. 9A, the two external wires 61 and 62 connect the anode terminal 42a and the cathode terminal 52a to an AC power supply 70 (refer to FIG. 9B). In this manner, the planar light emitting devices 1a and 1b may easily be connected so that light may be emitted with an AC power supply.

Figure 11:
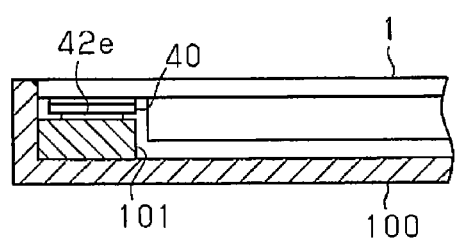
FIG. 11 is a partially enlarged cross-sectional view showing the light emitting panel and a case.

External wires used to supply power to a planar light emitting device and external wires used to connect a plurality of planar light emitting devices in series or in parallel are arranged in, for example, a case that accommodates a planar light emitting device. As shown in FIG. 11, a case 100, which accommodates the planar light emitting device 1, includes a connection member 101. The connection member 101 is, for example, a wiring cable or a wiring substrate. The connection member 101 includes a terminal that contacts the connection terminal 42e on the connection substrate of the planar light emitting device 1, which is accommodated in the case 100. Although FIG. 11 shows the connection terminal 42e, the other connection terminals 42a to 42d and 52a to 52e (refer to FIG. 1A) also contact the terminal of the connection member 101 in the same manner. In this manner, by accommodating the planar light emitting device 1 in the case 100, the connection terminals 42a to 42e and 52a to 52e may be supplied with power and connected to other planar light emitting devices.

The present embodiment has the advantages described below.

(1) The power supplying units 24a to 24e (power supplying auxiliary electrodes 27a to 27e), which are electrically connected to the planar anode 21 or the planar cathode 23 of the organic EL element 13, are formed along one side of the transparent substrate 11, which is tetragonal as viewed from above, and the power supplying units 25a to 25e (power supplying auxiliary electrodes 28a to 28e), which are electrically connected to the planar anode 21 or the planar cathode 23 of the organic EL element 13, are formed along the other parallel side of the transparent substrate 11. The connection member 14 connects the connection substrate 40 to the power supplying units 24a to 24e (power supplying auxiliary electrodes 27a to 27e).

The five connection electrodes 43a to 43e are formed on the main surface of the connection substrate 40 that faces the five power supplying units 24a to 24e. The five connection terminals 42a to 42e are formed on the main surface of the connection substrate 40 opposite to the main surface that faces the power supplying units. The five connection terminals 42a to 42e and the five connection electrodes 43a to 43e are electrically connected by the anode bus lines 44 or the cathode bus lines 45. The three power supplying units 24a, 24c, and 24e (three power supplying auxiliary electrodes 27a, 27c, and 27e) are electrically connected to one another by the anode bus lines 44 of the connection substrate 40, and the two power supplying units 24b and 24d (two power supplying auxiliary electrodes 27b and 27d) are electrically connected to each other by the cathode bus lines 45 of the connection substrate 40. Accordingly, among the five power supplying units 24a to 24e, there is no need to connect power supplying units having the same polarity on the transparent substrate 11. This allows for each of the power supplying units 24a to 24e to be narrowed. Consequently, the area of the region that does not emit light may be reduced in the transparent substrate 11.

(2) The anode bus lines 44 and the cathode bus lines 45 are formed facing toward the insulation substrate 41. This allows increases in the width of the insulation substrate 41 to be limited.

(3) Bus line having the same polarity as the power supplying units 24a to 24e are formed on the portion of the insulation substrate 41 facing toward the power supplying units 24a to 24e, and bus lines having the opposite polarity are formed on the portion of the insulation substrate 41 opposite to the portion facing toward the power supplying units. The through holes 44a and 45a formed on the insulation substrate 41 electrically connect the bus lines formed on the two surfaces of the insulation substrate 41. Accordingly, the anode bus lines 44 and the cathode bus lines 45 may be formed on substantially the same straight line as viewed from above. This allows increases in the width of the insulation substrate 41 to be limited.

(4) Each of the through holes 44a and 45a are formed to be overlapped with the power supplying auxiliary electrodes 27a to 27e having the same polarity as the anode bus lines 44 or the cathode bus lines 45 connected to the through holes 44a and 45a. Accordingly, in comparison with through holes formed at locations that are not overlapped with power supplying auxiliary electrodes, enlargement of the insulation substrate 41 may be limited. Further, there is no need for a member that insulates a power supplying auxiliary electrode and a through hole that have different polarities.

(5) The two power supplying unites 24a and 24e, which have the same polarity, are formed on the two ends of two predetermined parallel sides of the transparent substrate 11. The two connection terminals 42a and 42e and 52a and 52e having different polarities are formed on the two ends of each of the connection substrates 40 and 50. Accordingly, when a plurality of planar light emitting devices 1 are arranged in the longitudinal direction of the connection substrates 40 and 50, connected terminals having different polarities are adjacent to each other in two adjacent planar light emitting devices 1. Thus, the two planar light emitting devices 1 may easily be connected in series.

(7) The two connection terminals 42a and 52a (42e and 52e) having different polarities are each formed on the ends located at the same sides of the two connection substrates 40 and 50. Accordingly, when a plurality of planar light emitting devices 1 are laid out in the direction in which the connection substrates 40 and 50 are arranged, connection terminals having different polarities are located adjacent to each other in two adjacent planar light emitting devices 1. Thus, the two planar light emitting devices 1 may easily be connected in series.

(8) The connection electrode 43a includes the sub-electrodes 46, which are spaced apart from one another along the corresponding bus line 44 and extend in a direction perpendicular to the bus line 44. The connection electrode 43, which is formed in such a manner, improves the compression-bonding with the connection member 14. Accordingly, each of the connection electrodes 43a to 43e includes a plurality of sub-electrodes and limits defoliation of the connection substrate 40 from the transparent substrate 11.

The above embodiment may be modified as described below.

The shapes of connection terminals 42a to 42e and 52a to 52e may be changed. For example, the connection terminals 42a to 42e and 52a to 52e may be shaped to allow for direct soldering to the external wires 61 to 64 (refer to FIG. 5) and the like. Further, the connection terminals 42a to 42e and 52a to 52e may be shaped to allow for connection of a connector that facilitates the coupling and removal of an external wire. Although the type of connector is not limited, a narrow-pitch connector is preferred. The narrow-pitch connector allows two substrates to be connected to each other and a substrate and a flexible substrate to be connected to each other.

Figure 12:
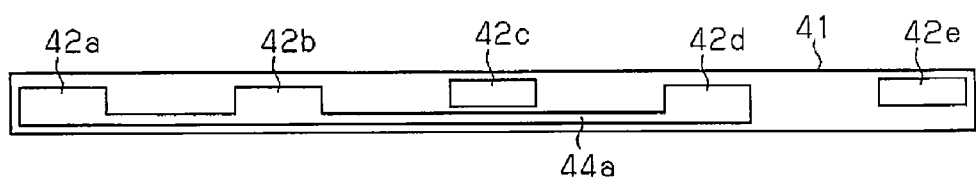
FIG. 12 is a schematic diagram of the connection substrate.

The location of each connection terminal may be changed. For example, as shown in FIG. 12, the connection terminals 42a to 42e may be shifted in the lateral direction of the insulation substrate 41. In such a layout, the connection terminals 42a, 42b, and 42d of the same polarity (anode) may be connected to one another by a bus line 44a formed on one main surface of the insulation substrate 41. Although not shown in the drawings, the intervals between the connection terminals 41a to 42e may be changed.

The number of power supplying units may be changed. Obviously, when changing the number of power supplying units, the number of power supplying auxiliary electrodes and the number of connection electrodes, which are formed on each connection substrate, are changed accordingly.

The number of connection terminals formed on each connection substrate may be changed.

Instead of using the cover glass 12, the organic EL element 13 may be encapsulated in resin.

The connection member 14 is not limited to an anisotropic conductive film. For example, solder may be used to electrically connect the power supplying auxiliary electrodes and the connection electrodes.

The insulation substrate 41 may be a multilayer substrate. For example, films of polyimide resin or the like may be stacked to form the insulation substrate 41. In this case, the bus lines 44 and 45 may be formed on an inner layer to decrease the width of the connection substrate 40. Further, the widths of the bus lines 44 and 45 may be increased, and the resistance of the bus lines 44 and 45 may be decreased.

The invention claimed is:

1. A planar light emitting device comprising:
   a light emitting panel including a transparent substrate, which is tetragonal as viewed from above, an organic EL element, which is formed on one main surface of the transparent substrate and includes an anode and a cathode, and a plurality of power supplying units, which are formed along at least one side of the transparent substrate and are each connected to either one of the anode or cathode of the organic EL element;
   a plurality of connection substrates including an insulation substrate arranged facing toward the power supplying units, a plurality of connection electrodes formed on a first main surface of the insulation substrate facing toward the power supplying units, a plurality of connection terminals formed on a second main surface of the insulation substrate on the opposite side of the first main surface, an anode bus line that electrically connects, among the connection terminals and the connection electrodes, a connection terminal and a connection electrode that correspond to the anode of the organic EL element to each other, and a cathode bus line that electrically connects, among the connection terminals and the connection electrodes, a connection terminal and a connection electrode that correspond to the cathode of the organic EL element to each other; and
   a connection member that electrically connects the power supplying units of the light emitting panel and the connection terminals of the connection substrates.

2. The planar light emitting device according to claim 1, wherein the anode bus line and the cathode bus line are formed facing toward the insulation substrate.

3. The planar light emitting device according to claim 1, wherein
   the anode bus line and the cathode bus line are arranged on the first main surface of the insulation substrate facing toward the power supplying units having the same polarity as the anode bus line and the cathode bus line;
   the anode bus line and the cathode bus line are arranged on the second main surface of the insulation substrate in correspondence with the power supplying units having a polarity that differs from the anode bus line and the cathode bus line; and
   the insulation substrate includes a plurality of through holes electrically connecting the anode bus line and the cathode bus line respectively formed on the two surfaces of the insulation substrate so that same polarities are paired.

4. The planar light emitting device according to claim 1, wherein
   the power supplying units includes at least one anode power supplying unit connected to the anode of the organic EL element and at least one cathode power supplying unit connected to the cathode of the organic EL element;
   the anode bus line is arranged on the first main surface of the insulation substrate facing toward the at least one anode power supplying unit, and the cathode bus line is arranged on the first main surface of the insulation substrate facing toward the at least one cathode power supplying unit;
   the cathode bus line is arranged on the second main surface of the insulation substrate in correspondence with the at least one anode power supplying unit, and the anode bus line is arranged on the second main surface of the insulation substrate in correspondence with the at least one cathode power supplying unit; and
   the insulation substrate includes at least one first through hole, which electrically connects the anode bus line formed on the two surfaces of the insulation substrate, and at least one second through hole, which electrically connects the cathode bus line formed on the two surfaces of the insulation substrate.

5. The planar light emitting device according to claim 3, wherein
   each of the power supplying units include a power supplying auxiliary electrode formed on a main surface facing toward the insulation substrate, and
   each of the through holes is arranged to be overlapped with the power supplying auxiliary electrode having the same polarity as the anode bus line or the cathode bus line connected to each of the through holes.

6. The planar light emitting device according to claim 1, wherein
   the power supplying units includes two power supplying units having the same polarity and arranged on two ends of one of two predetermined parallel sides of the transparent substrate, and
   the connection terminals include two connection terminals having different polarities and arranged on two ends of one of two predetermined parallel sides of the insulation substrate.

7. The planar light emitting device according to claim 1, wherein
   the transparent substrate is tetragonal;
   the power supplying units are arranged along, among four sides of the transparent substrate, two predetermined parallel sides;
   the organic EL element includes one main surface of the anode;
   a plurality of auxiliary electrodes formed on the one main surface of the anode of the organic EL element to extend along two sides that differ from the two predetermined parallel sides, and electrically connected to the anode.

8. The planar light emitting device according to claim 7, wherein the connection terminals are two connection terminals, and the two connection terminals having different polarities are arranged on two ends of two predetermined parallel sides in the two connection substrates.

9. The planar light emitting device according to claim 1, wherein the connection electrodes are laid out spaced apart from each other along the anode bus line or the cathode bus line connected to the connection electrodes and include a plurality of sub-electrodes extending in a direction perpendicular to the anode bus line or the cathode bus line.

* * * * *